(12) United States Patent
Hudz et al.

(10) Patent No.: US 8,083,301 B2
(45) Date of Patent: Dec. 27, 2011

(54) GLOBAL RACK SYSTEM

(75) Inventors: Andrew Hudz, Etobicoke (CA); Peter Jeffery, West Hill (CA); Zia Shariff, Toronto (CA); Eino A. Aapro, Cobourg (CA)

(73) Assignee: Sanmina-Sci Corporation, San Jose, CA (US)

( * ) Notice: Subject to any disclaimer, the term of this patent is extended or adjusted under 35 U.S.C. 154(b) by 19 days.

(21) Appl. No.: 12/355,493

(22) Filed: Jan. 16, 2009

(65) Prior Publication Data
US 2009/0236957 A1 Sep. 24, 2009

Related U.S. Application Data

(63) Continuation of application No. 11/289,879, filed on Nov. 30, 2005, now Pat. No. 7,478,890, which is a continuation-in-part of application No. PCT/US2004/17351, filed on Jun. 1, 2004.

(60) Provisional application No. 60/474,561, filed on May 30, 2003.

(51) Int. Cl.
*A47B 47/00* (2006.01)

(52) U.S. Cl. .................................. 312/265.4; 312/265.5

(58) Field of Classification Search .... 312/265.1–265.6, 312/296, 140, 257.1, 297; 211/26, 182; 403/171, 403/176, 294
See application file for complete search history.

(56) References Cited

U.S. PATENT DOCUMENTS

| | | | |
|---|---|---|---|
| 3,404,931 A | 10/1968 | Fall et al. | |
| 4,782,637 A | 11/1988 | Eriksson et al. | |
| 5,001,602 A * | 3/1991 | Suffi et al. | 361/724 |
| 5,020,866 A | 6/1991 | McIlwraith | |
| 5,165,770 A | 11/1992 | Hahn | |
| 5,333,950 A | 8/1994 | Zachrai | |
| 5,806,945 A | 9/1998 | Anderson et al. | |
| 5,806,946 A | 9/1998 | Benner et al. | |

(Continued)

FOREIGN PATENT DOCUMENTS

DE 4140072 6/1993

(Continued)

OTHER PUBLICATIONS

PCT International Search Report (PCT/US04/17351) Date of Mailing Sep. 7, 2005; 1 page.

(Continued)

*Primary Examiner* — Janet M Wilkens
(74) *Attorney, Agent, or Firm* — Foley & Lardner LLP; Matthew L. Fenselau

(57) ABSTRACT

A rack system for electronic and/or electrical equipment including a frame, a front door mounted to the front of the frame, a back door or panel, two side panels mounted to the back and two sides of the frame, and a top panel mounted to the top of the frame. The doors can be single doors or dual doors. The frame includes a rectangular base frame constructed by four horizontal edge members, and a top frame having the same structure as the base frame, and four vertical members each extending between two associate corners of the base frame and the top frame, and joining the base frame and top frame together. The horizontal members and vertical members are contoured with step-like structures, so that the rack has a high stiffness and strength. The door includes a hinge and a latch attached to two vertical members. The panels are provided with tabs and latches for securing the panels to the frame.

16 Claims, 15 Drawing Sheets

U.S. PATENT DOCUMENTS

| | | | |
|---|---|---|---|
| 5,938,302 A * | 8/1999 | Anderson et al. | 312/223.1 |
| 5,975,659 A | 11/1999 | Yang et al. | |
| 5,992,646 A | 11/1999 | Benner et al. | |
| 6,030,063 A | 2/2000 | Benner | |
| 6,174,034 B1 | 1/2001 | Benner et al. | |
| 6,213,577 B1 | 4/2001 | Rooyakkers et al. | |
| 6,215,654 B1 * | 4/2001 | Wilkie et al. | 361/605 |
| 6,217,138 B1 | 4/2001 | Benner et al. | |
| 6,231,142 B1 | 5/2001 | Pochet | |
| 6,238,027 B1 | 5/2001 | Kohler et al. | |
| 6,425,648 B1 | 7/2002 | Notohardjono et al. | |
| 6,428,127 B1 | 8/2002 | Rasmussen | |
| 6,814,417 B2 | 11/2004 | Hartel | |
| 7,478,890 B2 * | 1/2009 | Hudz et al. | 312/265.4 |
| 2001/0050516 A1 | 12/2001 | Minoura et al. | |
| 2002/0017839 A1 | 2/2002 | Wei | |
| 2002/0172013 A1 | 11/2002 | Chandler | |
| 2003/0034717 A1 * | 2/2003 | Yao | 312/223.1 |
| 2004/0075371 A1 | 4/2004 | Latchinian | |
| 2004/0201335 A1 * | 10/2004 | Davis | 312/265.3 |
| 2005/0174020 A1 | 8/2005 | Francisquini | |

FOREIGN PATENT DOCUMENTS

| | | |
|---|---|---|
| DE | 29623551 | 10/1998 |

OTHER PUBLICATIONS

PCT International Search Report (PCT/US06/44879) Date of Mailing Oct. 1, 2007; 1 page.

*Supplementary European Search Report*, European Application No. 04754052, Oct. 21, 2009 (2 pages).

* cited by examiner

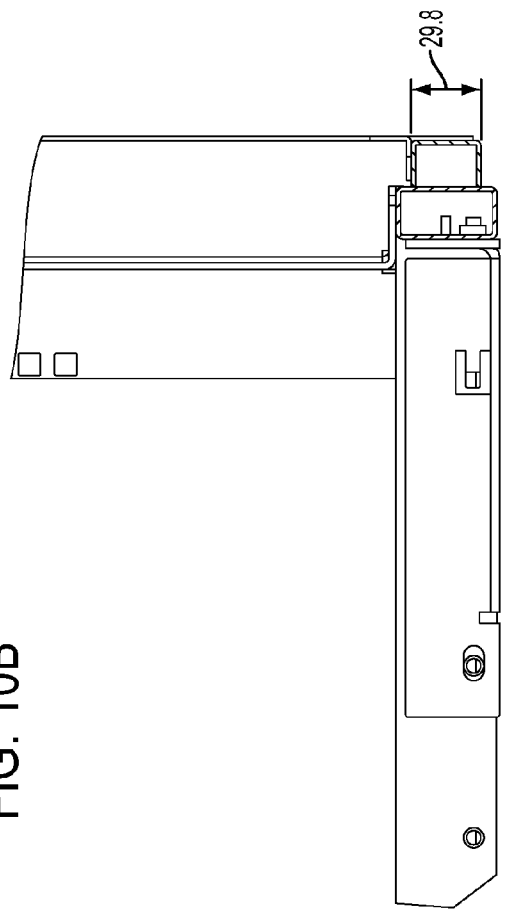
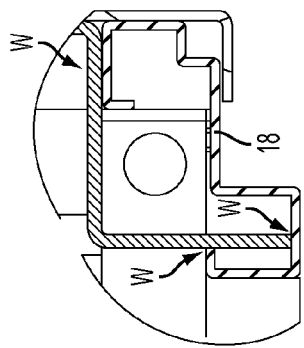
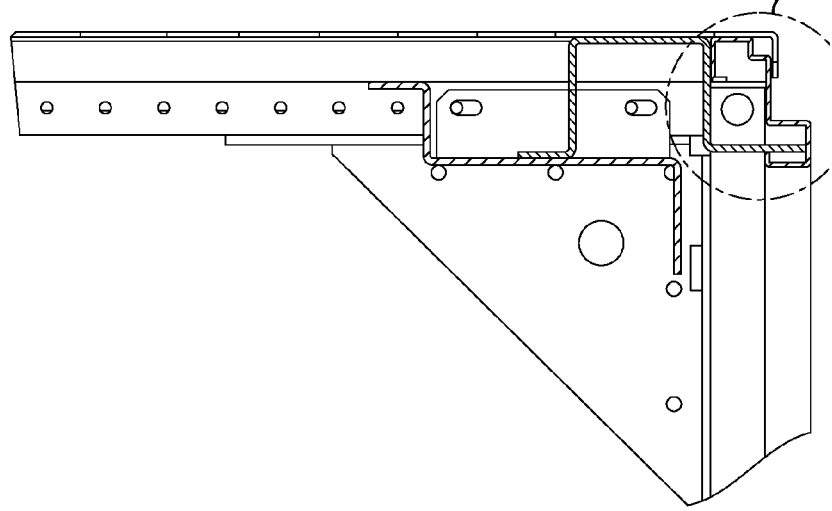
FIG. 10B
FIG. 10C
FIG. 10A

GLOBAL RACK SYSTEM

CROSS REFERENCES TO RELATED APPLICATIONS

This application is a continuation of U.S. application Ser. No. 11/289,879, filed Nov. 30, 2005 which claims priority to PCT international application PCT/US2004/017351, filed Jun. 1, 2004, which claims priority to U.S. Provisional Application Ser. No. 60/474,561 filed May 20, 2003. The entire contents of each of the above mentioned applications is incorporated herein by reference.

FIELD OF THE INVENTION

The present invention relates to racks for electronic and/or electrical equipment and, more particularly, to racks having high stiffness and strength.

BACKGROUND OF THE INVENTION

A common use of equipment racks of the type to which the present invention relates is for containing electronic or electrical equipment in the racks. In general, the rack has a box-like shape, including a base, side members extending upwardly from the base, and a top mounted to the top ends of the side members. The base, top, and side members form an enclosure within which the electronic or electrical equipment is disposed.

Preservation of electronic or electrical equipment from damage of crushing or other burden, for example, rubbles of earthquakes and aftershocks, for the maintenance of communications and other purposes is a major concern. It is possible to make an equipment rack that is strong enough to avoid these damages by using heavier material and more bracing members, but this adds significantly to the cost. Heavier material and more bracing, therefore, are not a solution acceptable in the competitive environment of modem rack systems. In addition, it has been found that lighter weight, yet more rigid equipment racks behave more favorably during shaking of the type that the rack system may encounter during earthquakes or other situations.

What is desired is a new and improved electronic and/or electrical equipment rack system having high stiffness and strength with low cost. Preferably, the improved rack will include increased structural rigidity without a substantial increase in weight.

SUMMARY OF THE INVENTION

The present invention provides a rack system for containing electronic and/or electrical equipment. The rack system preferably includes a frame having a box-like structure, a front door mounted to the front of the frame, a back door or panel mounted to the back of the frame, two side panels mounted to two sides of the frame, and a roof panel mounted to the top of the frame.

The frame of the rack generally includes a rectangular base frame constructed by four horizontal edge members, a top frame having the same structure as the base frame, and four vertical members each extending between two associated corners of the base frame and the top frame, and joining the base frame and top frame together. The horizontal members and vertical members are preferably joined by welding, or by other means, for example bolts, or by combinations of these means. The doors can be single doors or dual doors.

In a preferred embodiment, the vertical member is preferably fabricated from a sheet of a metal or other materials, and includes a step-like cross-section. The vertical member preferably includes a first section, a second step-like section, and a third section. The first section and the third section are angularly joined to two ends of the second step-like section, preferably forming an angle of 90 degrees. The second step-like section defines a two-step-like interior side.

The horizontal member is preferably constructed by rolling a sheet of a metal or other materials and joining the two end edges of the sheet of metal or other materials. The two end edges are preferably curved into the interior of the roll and form two back-to-back attached "L". The two end edges are preferably joined by welding or other means. The horizontal member preferably includes a relatively large first section, and a relatively small second section positioned opposing to each other, and two step-like sections connected to two ends of the first section and the second section.

At the corners of the frame where the horizontal members and the vertical members are joined, the first section and third section of the vertical member are cut to a shorter length so that the first section and the third section can be positioned underneath and welded to a portion of the bottom surfaces of the horizontal members at the top corners, and support the top frame. The ends of the horizontal members are contoured to fit to and welded to the step-like interior side of the vertical member.

The frame may include at least a pair of struts each extending between two vertical members which are disposed within one surface plane of the rack. The struts enhance the strength of the frame.

In one preferred embodiment, the rack includes a door mounted to the front of the frame. The door includes at least one hinge attached to the left vertical member of the front side of the frame, and at least one latch attached to the right vertical member of the front side of the frame. The latch is for locking the door to the frame. The position of the hinge and latch can be reversed, so that the door can open in an opposite direction. The door also can be mounted on the back or the two sides of the frame, and the rack may include more than one doors so that a user can access the inside of the rack from different sides of the rack.

In another preferred embodiment, the rack further includes four casters mounted on four corners of the base frame to support the rack and facilitate movement of the rack. The rack may further include locating plates attached to the horizontal members at places where the casters are mounted to the base frame for stiffening the base frame. In one preferred embodiment, the base frame further includes four corner brackets which are coupled to the four inner corners of the base frame. The corner brackets enhance the strength of the base frame.

The side panel or back panel of the rack preferably includes a plurality of tabs extending from the top edge of the panel. The tabs are sized to insert into a plurality of slots defined by the horizontal member of the top frame. The panel may further be provided with two latch assemblies, preferably having a simple spring slam latch with a rotary key lock positioned behind it, for locking the panel to the frame. The cam of the lock, when in a locked position, prevents the slam latch from opening. The slam latch can use a conventional latch, for example, slide latch Part Number A3-40-525-12 of SOUTHCO™. In alternate embodiments, the panel may include tabs extending from the side edges or bottom edge, and the horizontal members or vertical members of the frame define associate slots for receiving the tabs.

The roof panel may also includes tabs extending outwardly from one edge of the roof panel and are adapted to insert into the slots defined by the horizontal members of the top frame. The roof panel may further include a latch disposed close to an edge opposite to the edge where the tabs extend. The tabs and the latch allow the roof panel to be secured to and removed from the top frame without using any tools.

BRIEF DESCRIPTION OF THE DRAWINGS

FIG. 4 is a perspective view of a frame of one embodiment of the present invention and FIGS. 4A-4C are enlarged views of corners of the frame shown in FIG. 4;

FIG. 10A is a detailed view of connection of corner brackets shown in FIG. 9B

FIG. 10B is a detailed view of step-like section connecting with support members shown in FIG. 10A FIG. 10C is a detailed view of connection of panels shown in FIG. 9C

DETAILED DESCRIPTION OF THE INVENTION

The present invention provides a new and improved electronic equipment rack system including features that provide the rack with exceptional strength and rigidity without substantially increasing the weight and cost of the rack. The rack system, in accordance with one preferred embodiment, generally includes a box-like frame, a door mounted to the front of the frame, a back door or panel and two side panels mounted to the back and two sides of the frame, and a roof panel mounted to the top of the frame.

Figure 1:
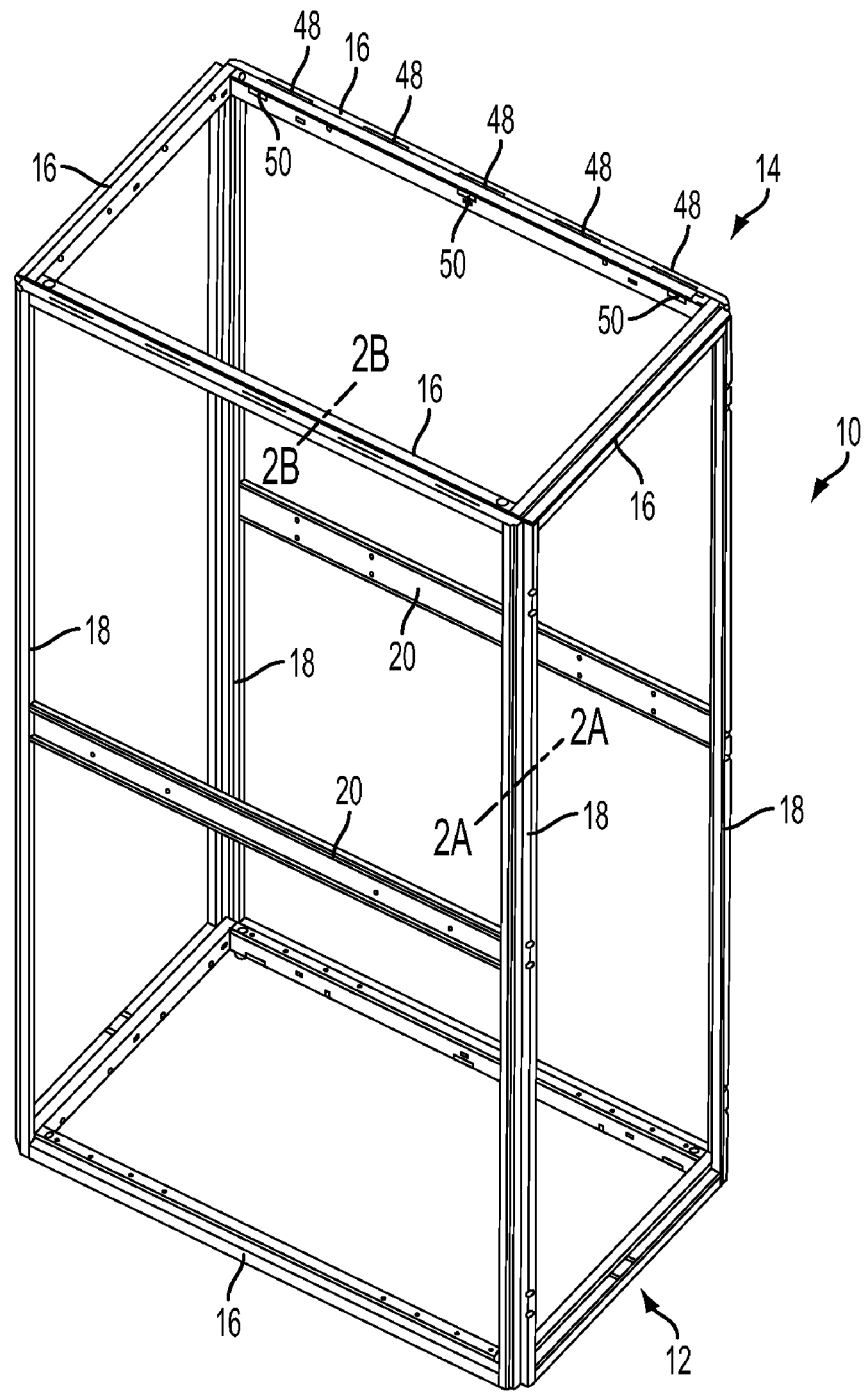
FIG. 1 is a perspective view of a frame of one embodiment in accordance with the present invention.

Referring to FIG. 1, the frame of the rack system 10 generally includes a rectangular base frame 12 constructed by four horizontal edge members 16, and a top frame 14 having the same structure as the base frame 12, and four vertical members 18 each extending between two associate corners of the base frame 12 and the top frame 14, and joining the base frame 12 and top frame 14 together. The base frame 12, top frame 14, and the four vertical members 18 form the elongated box-like frame structure 10.

The frame 10 may include one pair or more struts 20 each extending between two vertical members 18 which are disposed within the same surface plane of the rack. As shown in FIG. 1, the two struts 20 are preferably disposed in two opposite surfaces of the rack and preferably extend between two intermediate points of two vertical members 18. The two struts 20 may be disposed on the front and back of the frame 10, as shown in FIG. 1, or on the two sides of the frame 10. The horizontal members 16, the vertical members 18, and the struts 20 can be joined by welding or soldering, or other suitable means.

Figure 2:
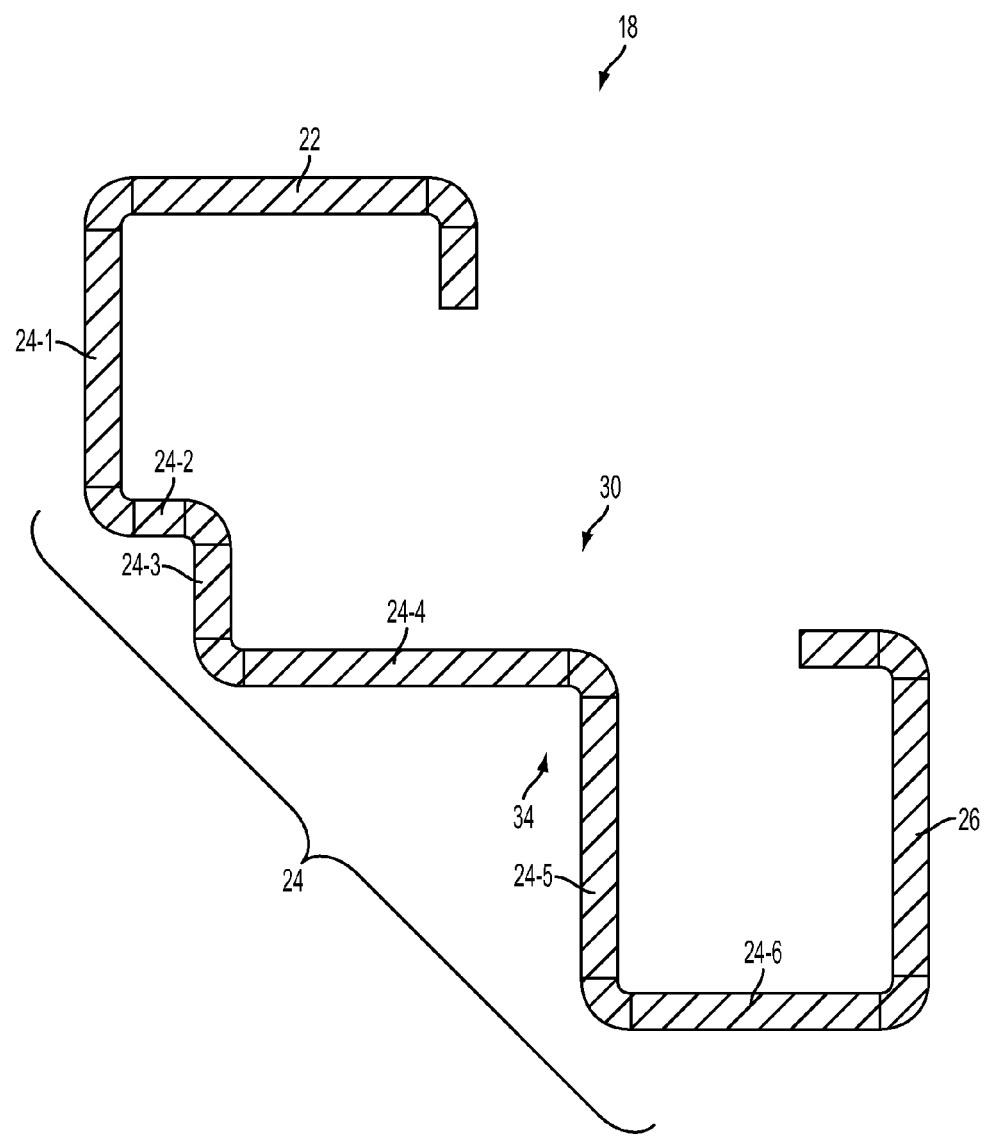
FIG. 2 is a cross-sectional view of a vertical member of the frame shown in FIG. 1 taken along line A-A in FIG. 1.

FIG. 2 shows a cross-sectional view of a preferred embodiment of the vertical member 8. The vertical member 18 is preferably constructed from a steel sheet or plate, extends along a longitudinal axis which is perpendicular to the cross-section shown in FIG. 2 and has a step-like profile. As shown in the cross-sectional view, the vertical member 18 includes a first section 22, a second step-like section 24, and a third section 26. The second step-like section 24 preferably has a two-step-like profile. The first section 22 and the third section 26 are angularly joined to two ends of the second step-like section 24, preferably forming an angle of 90 degrees. The first section 22 and third section 26 have protrusions extend inwardly from two ends of the two sections 22 and 26. The vertical member 18 is preferably manufactured by curving or rolling one sheet of a metal.

Figure 2A:
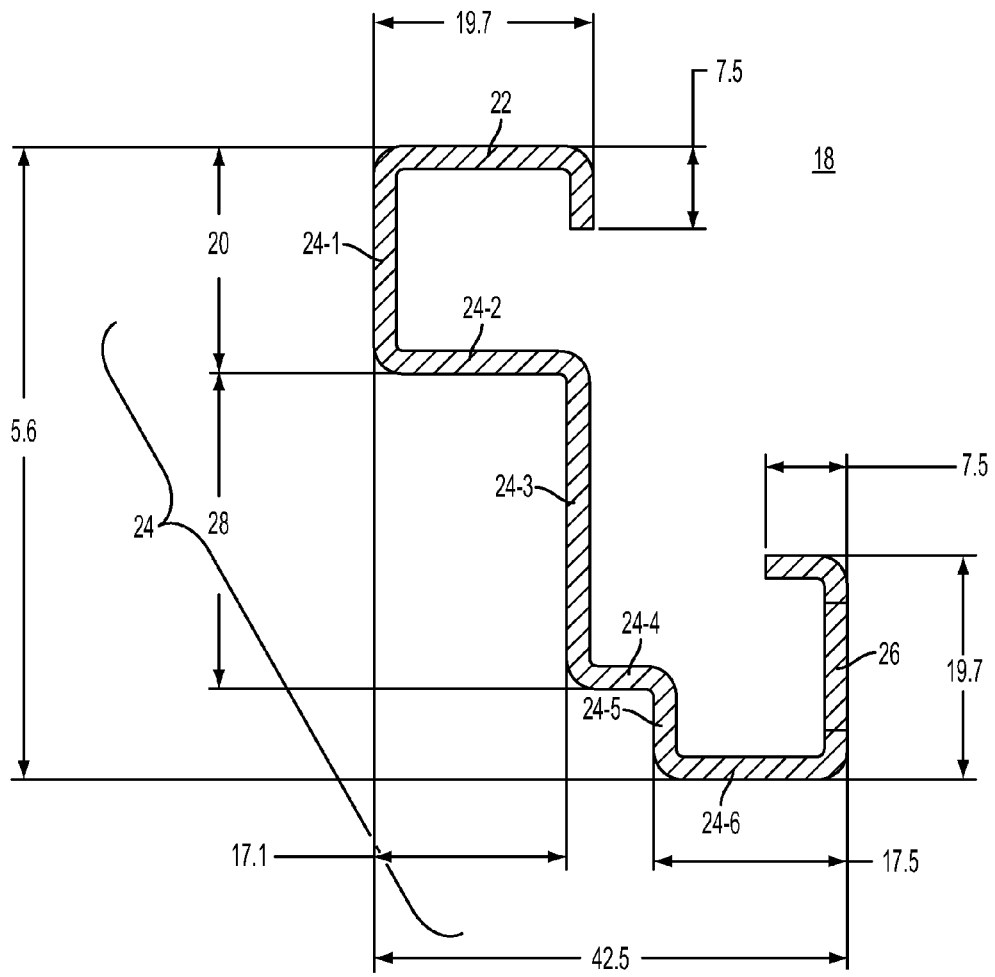
FIG. 2A is a cross-sectional view of an alternate vertical member for the frame shown in FIG. 1

An alternative form of vertical member 18 is shown in FIG. 2A. The step-like section 24 in both FIG. 2 and FIG. 2A, include "vertical" (as shown in those figures) sub-sections 24-1, 24-3, and 24-5 and "horizontal" (as shown in those figures) sub-sections 24-2, 24-4 and 24-6. The ratios of the various in-line sub-sections (e.g., 24-1, 24-3 and 24-5) may be varied in different embodiments. A preferred ratio for 24-1, 24-3 and 24-5 is 20:28:8. Other ratios may be used.

Figure 3:
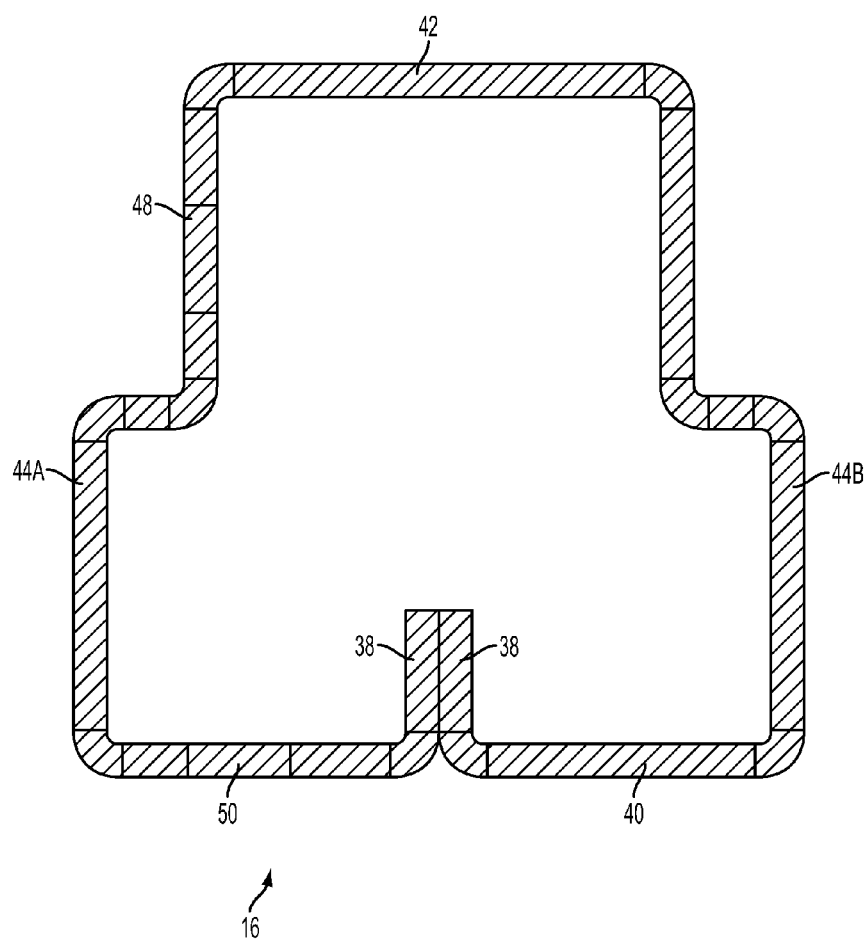
FIG. 3 is a cross-sectional view of a horizontal member of the frame shown in FIG. 1 taken along line B-B in FIG. 1.

FIG. 3-3A illustrates a cross-sectional view of the horizontal member 16. The horizontal member 16 extends along a longitudinal axis which is perpendicular to the cross-section shown in FIG. 3 and is preferably constructed from a steel sheet or plate which are rolled and joined at the two end edges 38 by welding. As shown in FIG. 3, the two end edges 38 are preferably curved into the interior of the roll and shaped like two back-to-back attached "L".

The horizontal member 16 includes a relatively large first section 40, a relatively small second section 42, and two step-like side sections 44A and 44B. In the frame 10, the first section 40 of the horizontal member 16 faces inward, and the second section 42 of the horizontal member 16 faces outward (as best shown in FIG. 8A). As shown in FIGS. 1 and 3, in one preferred embodiment, the horizontal member 16 further defines a plurality of slots 48 each extending along the longitudinal axis at the side section 44A and/or 44B and a plurality of slots 50 each extending along the longitudinal axis at the first section 40. The slots 48 and 50 are adapted for insertion of tabs of side panels, back panel, or roof panel which will be described in detail below.

Figure 4:
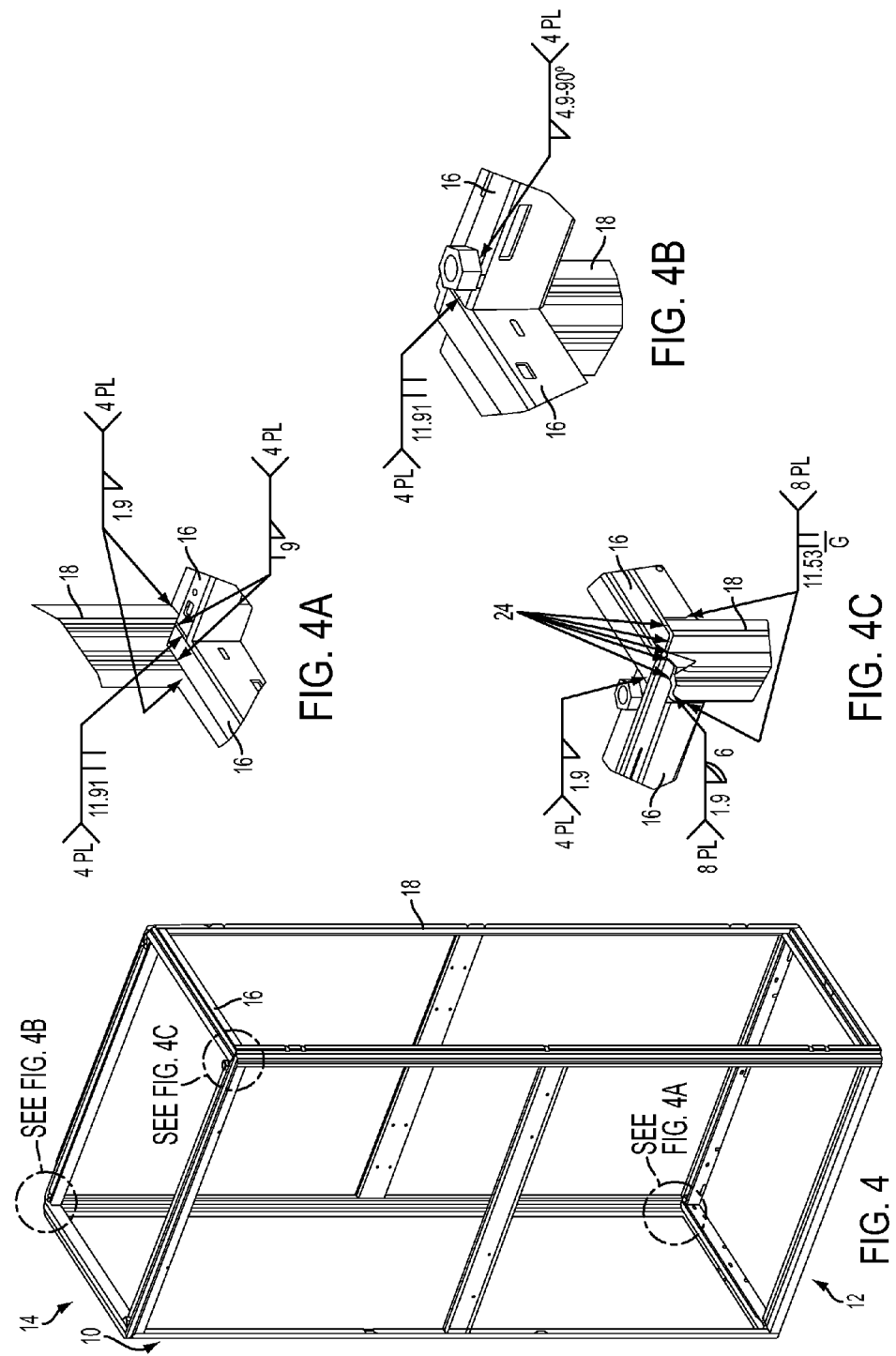

FIG. 4 is a perspective view of the frame 10 and FIGS. 4A-4C are enlarged views of the corners of the frame 10 shown in FIG. 4. The vertical member 18 defines a two-step-like interior side 30, and the edges of the ends of the horizontal members 16 are cut and contoured to fit the interior side 30 of the second step-like section 24 of the vertical member 18. As shown in FIGS. 4A-4C, the interior side 30 of the second section 24 of the vertical member 18 is coupled to the edges of the ends of two horizontal members 16. The first section 22 and third section 26 and the protrusions extending therefrom are cut to a shorter length than the second step-like section 24, such that the first section 22 and the third section 26, and the protrusions are disposed underneath the horizontal member 16 and are preferably welded to a section of the side section 44B of the horizontal members 16 at the upper corners as shown in FIGS. 4B and 4C, and, at the lower corners as shown in FIG. 4A, the first section 22 and the third section 26 are cut, and are disposed above and welded to a section of the side section 44A. The first section 22 and the third section 26 provide support to the base frame 12 and top frame 14. The horizontal members 16 and the vertical members 18 are joined, at the corners of the frame 10, by welding, welding nuts, bolts, other suitable means, or by combinations of these means.

Figure 5:
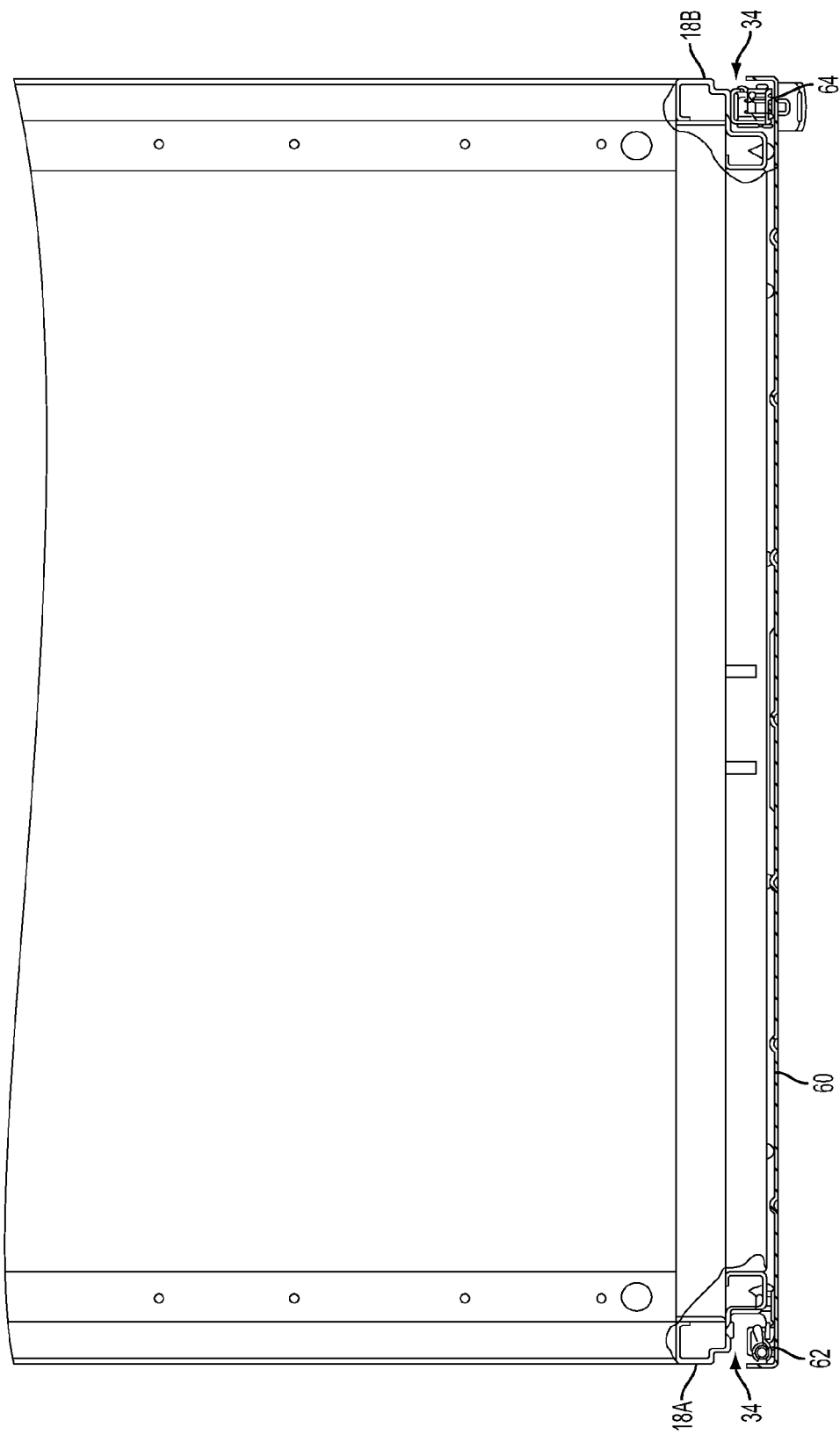
FIG. 5 is a perspective view of a door mounted to the frame shown in FIG. 1 and FIG. 4.

FIG. 5 shows an embodiment of the present invention in which the frame 10 is provided with a door 60 mounted on the front side of the frame 10. FIG. 5 is a top view of the embodiment, in which the two front corners are partially cut away to show the hinges and latches of the door 60. As shown in FIG. 5, the vertical member 18 defines a recess 34 at an exterior side opposite the interior side 30. The recesses 34 receive at least one hinge 62 and at least one latch 64 of the door 60. In the embodiment shown in FIG. 5, the left vertical member as denoted by 18A receives the hinge 62 and the right vertical member as denoted by 18B receives the latch 64, and the door 60 opens in a clockwise direction. The hinge 62 and the latch 64 can be reversed positioned, so that the door 60 can open in a counterclockwise direction. The door 60 also can be mounted to other sides of the frame 10, for example, on the back of the frame, or on the two sides of the frame. The hinge 62 may be a spring driven hinge, or "drop in" hinge, or other suitable hinges. The latch 64 may be a "3 or 4 point" latch which grabs the frame at 3 or 4 points. The door 60 also can be a dual door, and has two hinges respectively attached to the left vertical member 18A and the right vertical member 18B.

Figure 6:
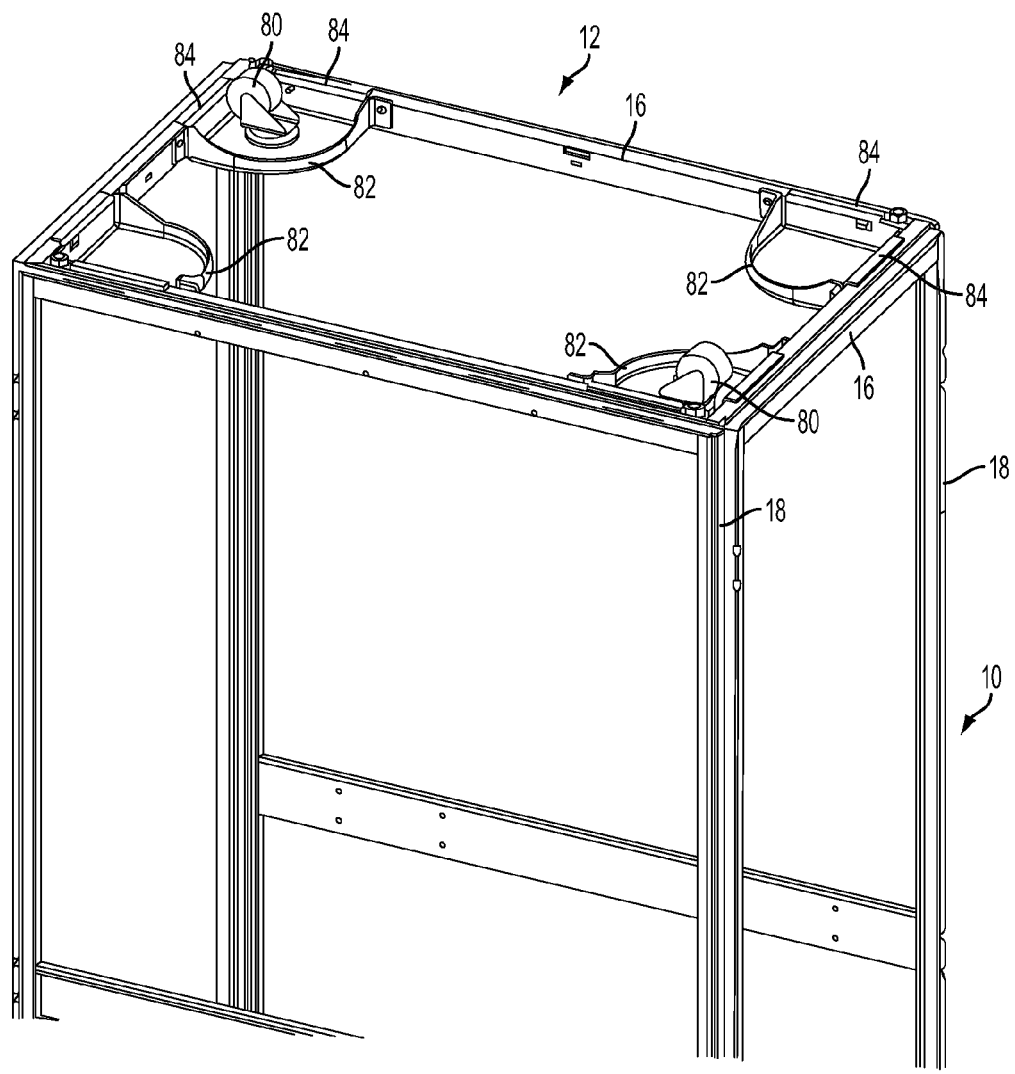
FIG. 6 is a perspective view of a lower portion of the frame shown in FIGS. 1 and 4 to show the bottom of the frame.

FIG. 6 is an upside-down view of the frame 10 to show the bottom of the frame 10. The frame 10 preferably further includes four casters 80 mounted on four corners of the base frame 12 (FIG. 6 only shows two casters 80). The four casters 80 support the rack and facilitate movement of the rack. In one preferred embodiment, the base frame 12 includes locating plates 84 attached to the horizontal members 16 at the corners of the base frame 12. The locating plates 84 enhance the strength of the base frame 12. Four corner brackets 82 are coupled to the four inner corners of the base frame 12 for stiffening the base frame 12. The corner brackets 82 can be convex-shaped as shown in FIG. 6, or concave-shaped, and can be curved- or angular-shaped. The bottom of the rack is preferably open, allowing air or wires to pass through.

Figure 7:
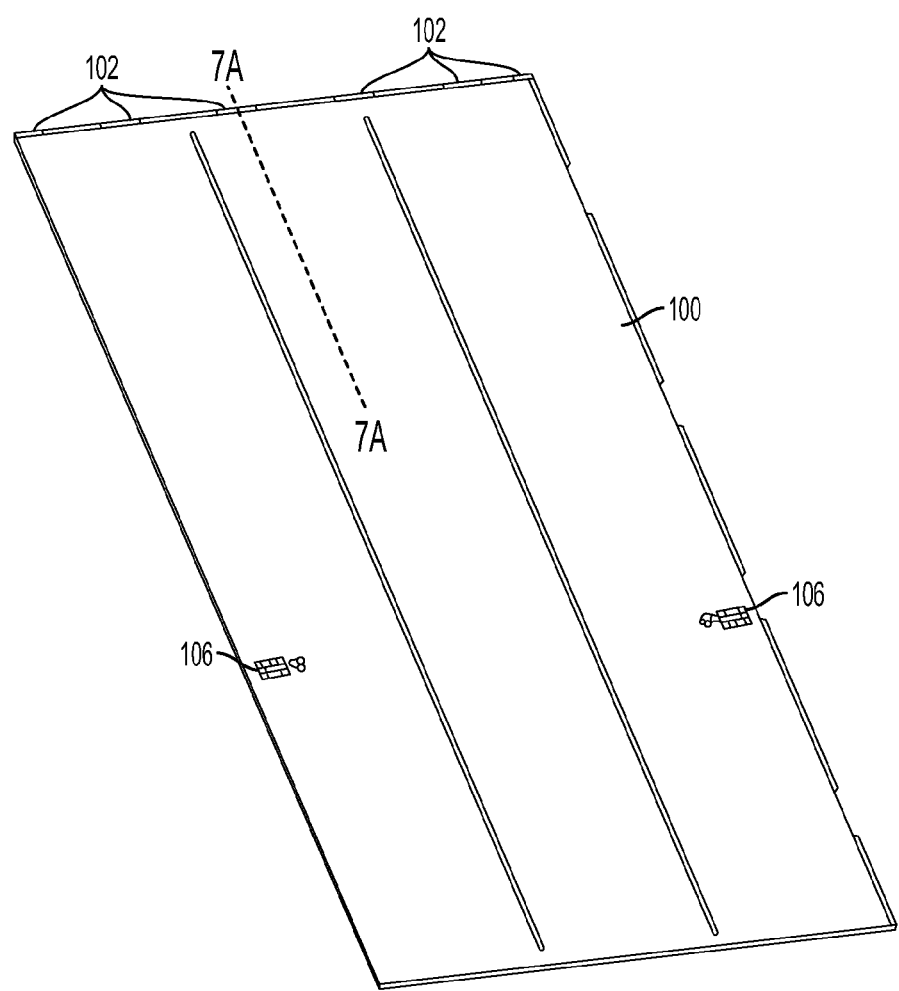
FIG. 7 is a perspective view of a panel adapted to be mounted onto the front or back, or sides of the frame shown in FIG. 1 and FIG. 4.
Figure 7A:
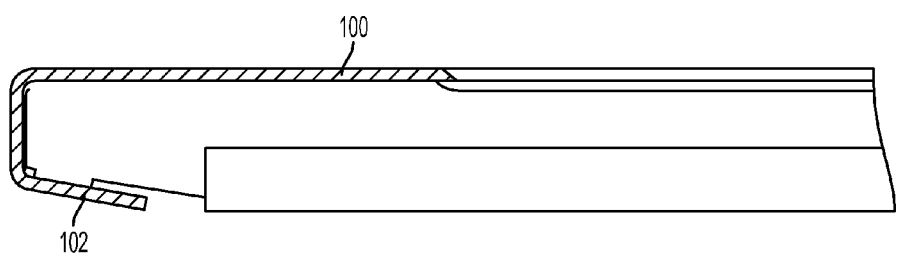
FIG. 7A is a cross-sectional view of an upper part of the panel shown in FIG. 7, taken along line C-C.
Figure 7B:
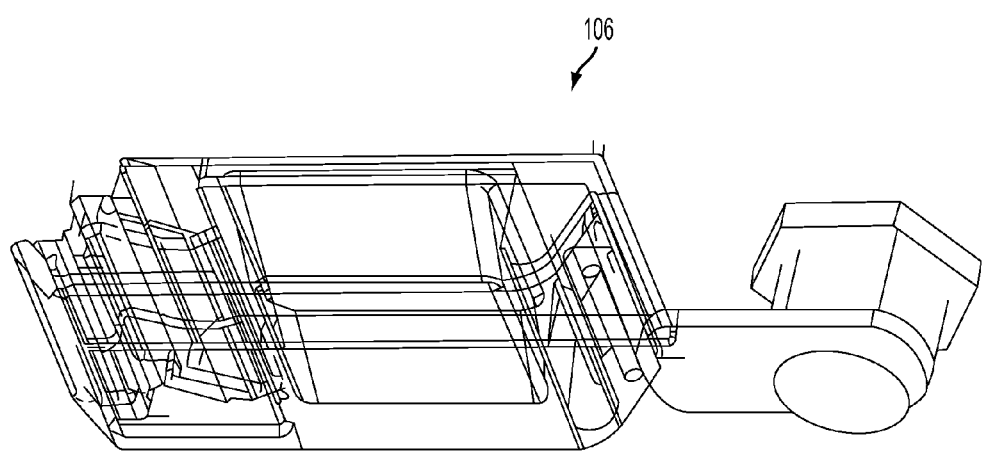
FIG. 7B is a schematic view of a latch assembly used with the panel in FIG. 7.
Figure 7C:
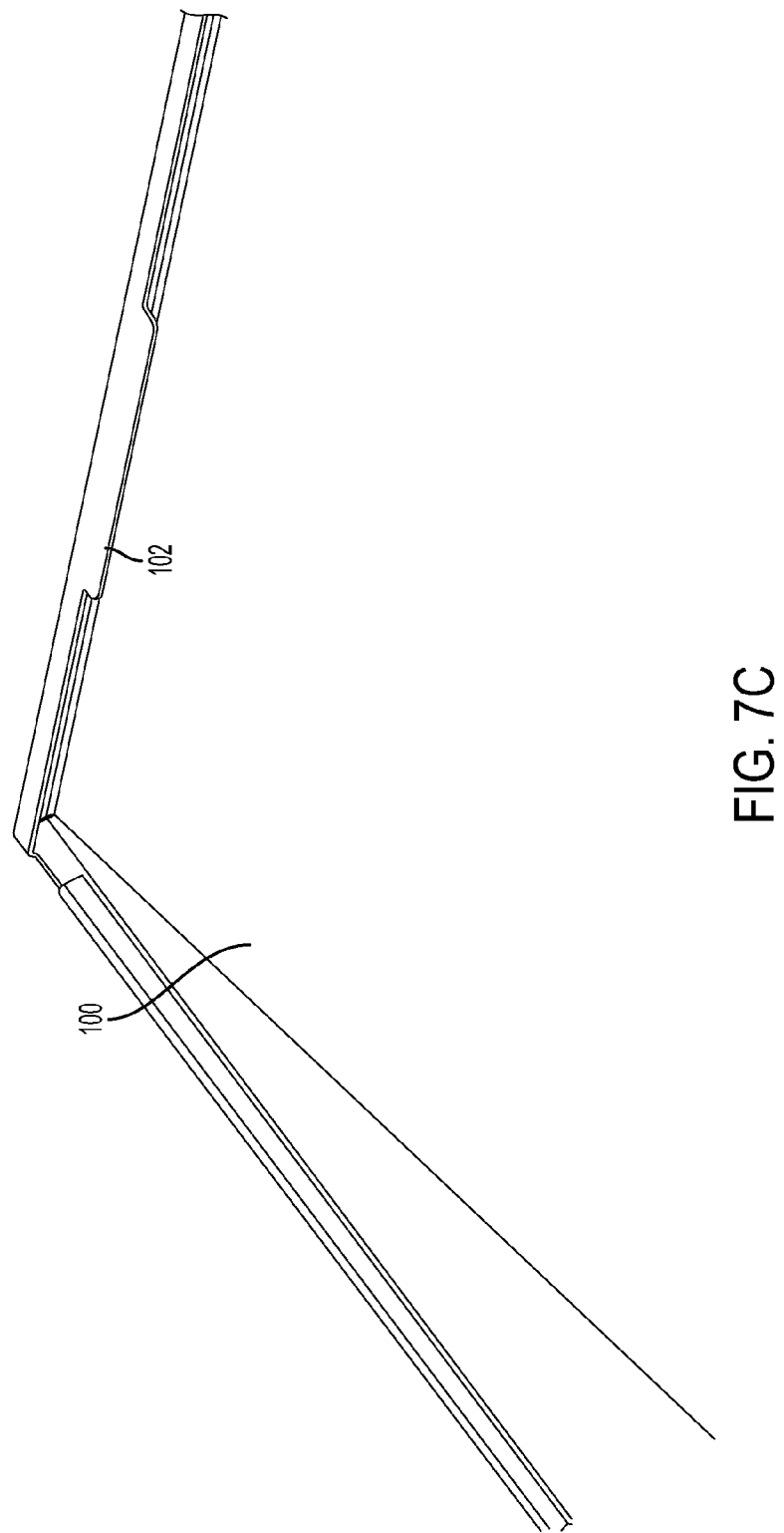
FIG. 7C is an enlarged view of an up-left corner of the panel shown in FIG. 7.

FIG. 7 shows a panel 100 which can be mounted to the front or back of the frame 10, or the two sides of the frame 10. FIG. 7A shows a cross-sectional view of an upper part of the panel 100, taken along line CC in FIG. 7, and FIG. 7C shows an exploded view of the up-left corner of the panel 100 in FIG. 7. The panel 100 preferably is fabricated from one sheet of a metal or other materials, and sized to fit in the front or back frame, or side frame. In one preferred embodiment, the panel 100 includes a plurality of tabs 102 extending from a top edge of the panel 100. The horizontal member 16 at the top frame 14 defines a plurality of slots 48 as best shown in FIGS. 1 and 3 for receiving the tabs 102. The panel 100 may also include tabs extending from the side edges or bottom edges of the panel 100, and the vertical and horizontal members of the frame 10 define associate slots for receiving the tabs. The panel 100 may further include two latch assemblies 106 preferably disposed close to the two side edges of the panel 100. FIG. 7B show a schematic view of the latch assembly 106.

The latch assembly 106 preferably includes a simple spring slam latch with a rotary key lock positioned behind it, for locking the panel to the frame. The cam of the lock, when in a locked position, prevents the slam latch from opening. The slam latch can be a conventional latch, for example, slide latch Part Number A3-40-525-12 of SOUTHCO™. The lock can be a ¼ turn keyed lock. The tabs 102 and the latches 106 secure the panel 100 to the frame 10. The rack preferably includes a front door mounted to the front frame, and a back panel and two side panels mounted on the back frame and two side frames. The rack also can be constructed with more than one door, for example, doors on the back or two sides, so that a user can access the inside of the rack through the back door or the side doors, and not only through the front door. The doors can be single doors or dual doors.

Figure 8:
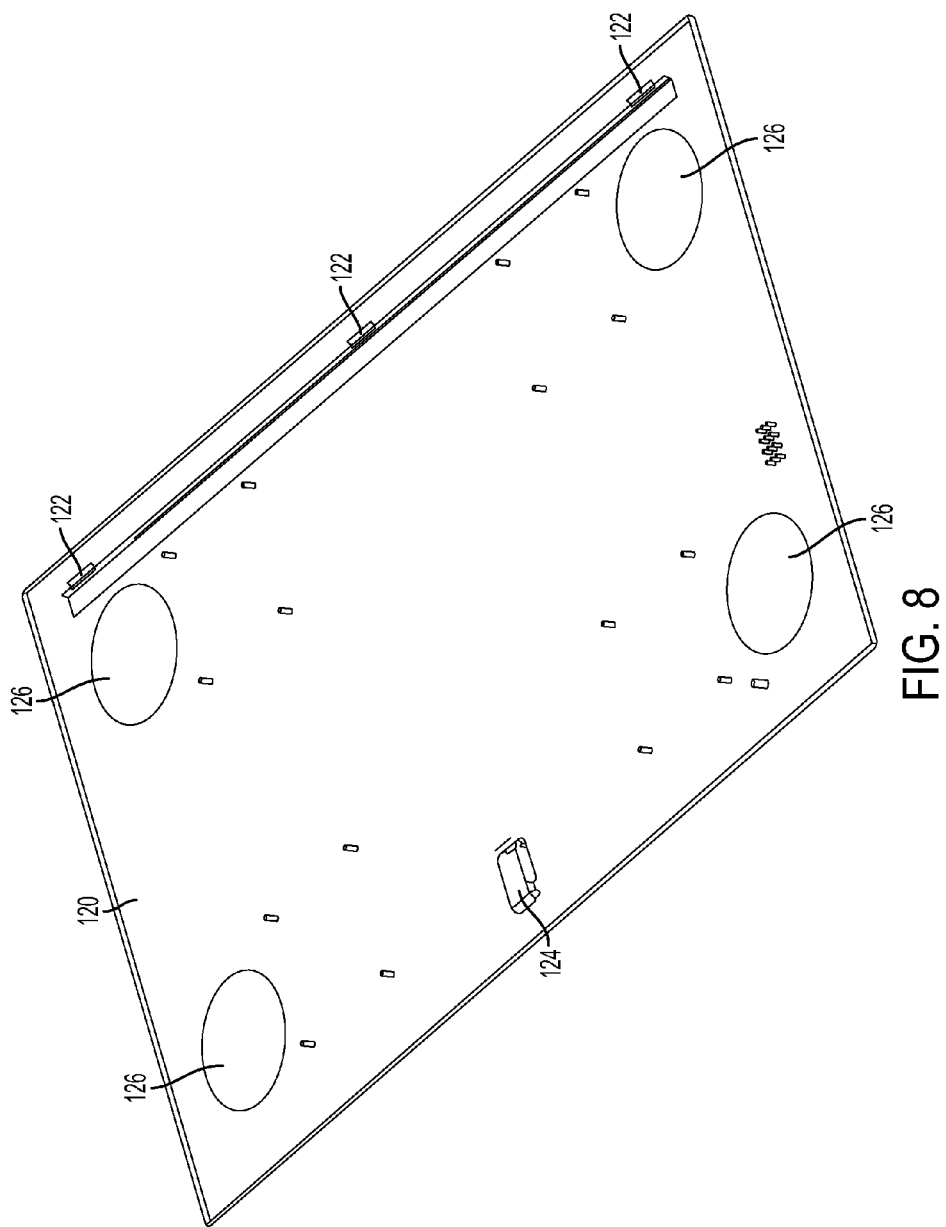
FIG. 8 is a perspective view of a top panel adapted to be mounted onto the top of the frame shown in FIG. 1 and FIG. 4.
Figure 8A:
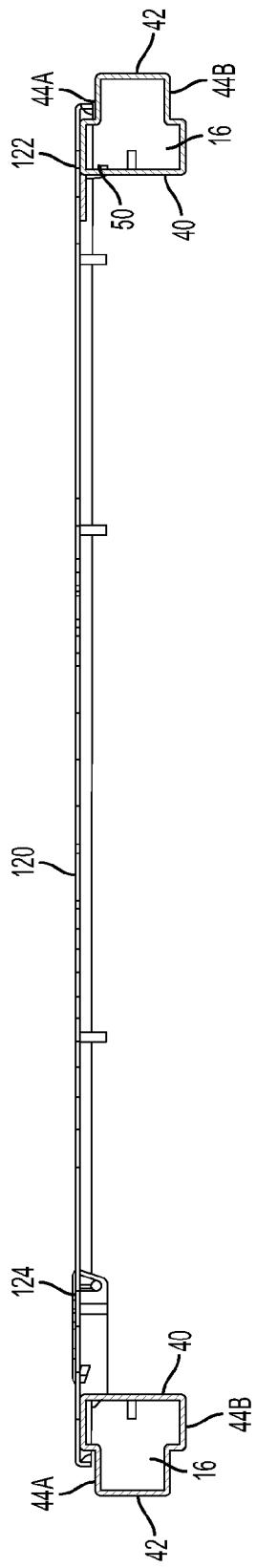
FIG. 8A is a front view of the top panel and two horizontal members of the top frame of FIG. 8.

FIG. 8 illustrates a roof panel 120 of the rack system in accordance with one preferred embodiment of the present invention. The roof panel 120 is preferably fabricated from one sheet of a metal or other materials and is sized to fit to the top frame 14. In one preferred embodiment, the roof panel 120 includes a plurality of tabs 122, extending from and parallel to a bottom surface of the roof panel 120. FIG. 8A shows a roof panel 120 mounted to two horizontal members 16 of the top frame 14. As best shown in FIG. 8A, the tabs 122 extend outwardly and are positioned close to an edge of the roof panel 120, and sized to be inserted into the slots 50 of the horizontal member 16 of the top frame 14. The roof panel 120 further includes a latch 124, preferably a slam latch, disposed close to an edge opposite the edge where the tabs 122 extend. The latch 124 is adapted to engage with the horizontal member 16 and locks the roof panel 120 to the top frame 14. The design of the roof panel 120 and the top frame 14 allows the roof panel 120 to be secured to and removed from the frame 10 without using any tools. In a preferred embodiment, the roof panel 120 further defines at least one hole 126 through the roof panel 120, allowing air or wires to enter into the rack.

Figure 9C:
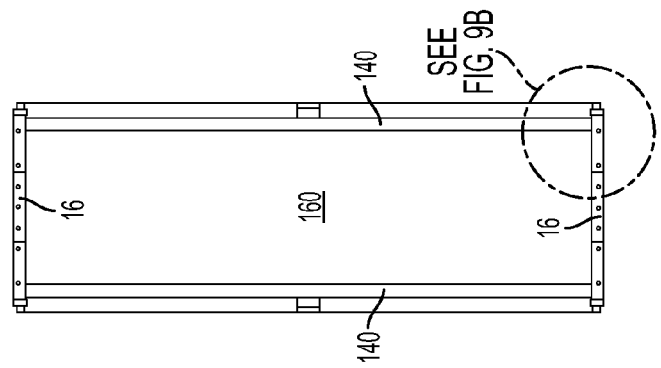
FIG. 9C is front view of the rack of FIG. 9A.
Figure 9B:
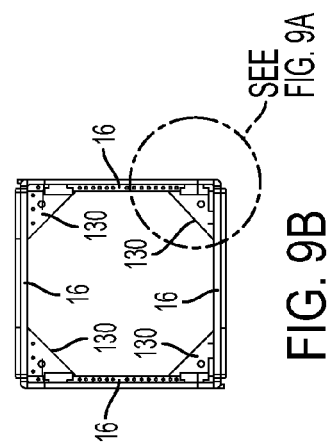
FIG. 9B is a view of the rack of FIG. 9A along lines X-X.
Figure 9A:
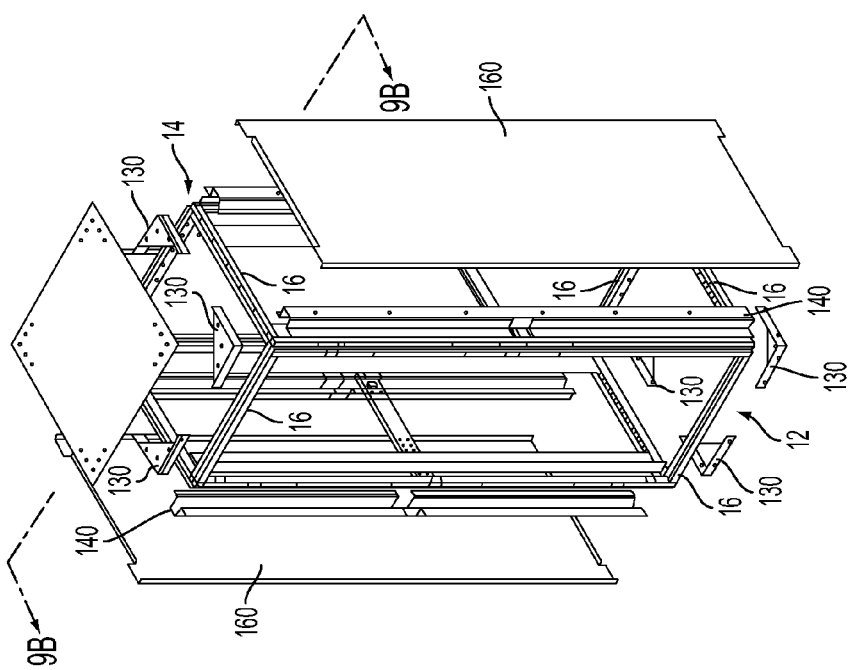
FIG. 9A is an exploded perspective view of an alternative embodiment of the invention.

FIG. 9A-9C illustrate a rack system 10' in accordance with an additional embodiment of the present invention. In the illustrated form, the basic frame structure is similar to that described above in conjunction with FIGS. 1-8. In FIGS. 9A-9C, similar elements are identified in the same reference numbers. The rack 10' includes four corner brackets 130 which are affixed to the four inner corners of both the rectangular base frame 12 and rectangular top frame 14, for stiffening those frames. As shown, each bracket extending in a plane perpendicular to the longitudinal axes of the respective vertical support members 18. In FIG. 9B, a view of the corner brackets 130 attached to the inner corners of a base is shown. In addition, each of four elongated u-shaped channel members 140 are affixed to a respective one of the vertical support members 18 and/or the corner brackets 130, preferably each elongated u-shaped channel member 140 is made from an elongated sheet material by bending said sheet material about an axis parallel to its longitudinal axis. The elongated u-shaped channels can be affixed to the elongated vertical members 18 by welding, or fastening means, to provide a rigid exterior structure. As shown in FIG. 9C, a top panel 150 is rigidly affixed to the top corner brackets 130 of upper frame 14 and two side surface panels 160 are rigidly affixed to and along the length of the elongated u-shaped channels 140 on each side of said rack 10'. The panels are preferably fabricated from one sheet of a metal or other materials, and sized to fit on the top or side frames by welding or fastening to provide a tight and rigid structure.

FIG. 10A-10C illustrate additional detail regarding rack 10' of FIGS. 9A-9C in accordance with an embodiment of the present invention. FIG. 10A provides detail on the connection found in FIG. 9B, between corner bracket, step-like section, and support members for a rigid, structure. Moreover, additional detail of FIG. 10A of cross-sectional step-like section and support members in FIG. 10B as the focal point of the structural fit. The unshaped channel 140 is preferably joined by welding to the vertical support member 18 at points along their respective lengths where those elements are adjacent. In FIG. 10B, exemplary weld points are denoted by "W." FIG. 10C provides additional detail on connection, found in FIG. 9C, between a side panel and support members for a rigid exterior of the rack system.

The invention may be embodied on other specific form without departing from the spirit or essential characteristics thereof. The present embodiments are therefore to be considered illustrative and not restrictive, the scope of the invention being dictated by the appended claims rather than by the foregoing description, and all changes which come within the meaning and range of equivalency of the claims are therefore intended to be embraced therein.

What is claimed is:

1. A rack system for containing electronic and/or electrical equipment, comprising:
   a. a rectangular base frame having four horizontal support members each extending along a longitudinal axis;
   b. a rectangular top frame having four horizontal support members each extending along a longitudinal axis;
   wherein each horizontal support member of said base frame and said top frame is made from an elongated sheet material extending along a longitudinal axis by bending the sheet material about an axis parallel to said longitudinal axis to form two step-like side peripheral surfaces, attaching two side elongated edges of said elongated sheet material together;
   c. four elongated vertical support members each extending along a longitudinal axis between and joined to two associated corners of said rectangular base frame and said rectangular top frame, wherein each said elongated vertical support member is made from an elongated sheet material extending along a longitudinal axis by bending said sheet material about an axis parallel to said longitudinal axis of said sheet material to form at least three elongated sections wherein adjacent sections are substantially perpendicular to each other;
   d. eight corner brackets each affixed to a respective inner corner of the rectangular base frame or a respective inner corner of the rectangular top frame; and
   e. four u-shaped channel members, each affixed to a respective one of the vertical support members or a respective one of the corner brackets; and
   further comprising panels mounted to surface planes of the rack system; and
   wherein said panels include a top panel attached to said top frame, wherein said top panel includes tabs extending outwardly from a first edge of said top panel, and said horizontal support member which is associated with said first edge defines slots facing and for receiving said tabs, wherein a second edge of said top panel opposite to said first edge includes a latch for locking said second edge to an associated said horizontal member.

2. A rack system for containing electronic and/or electrical equipment according to claim 1, wherein each panel is made from a unitary sheet of metal.

3. A rack system for containing electronic and/or electrical equipment according to claim 1, wherein said panels include a front panel, wherein a first side edge of said front panel is attached to an associated said vertical support member of said rack system by at least one hinge, such that said front panel is rotatable about said vertical support member, wherein said front panel forms an openable door.

4. A rack system for containing electronic and/or electrical equipment according to claim 3, wherein said hinge is mounted on the outside of the vertical support member of the rack system.

5. A rack system for containing electronic and/or electrical equipment according to claim 3, wherein said front panel include a latch attached to a second side edge opposite to said first side edge where the hinge is attached, wherein said latch is adapted to lock said second side edge to an associated said vertical support member.

6. A rack system for containing electronic and/or electrical equipment according to claim 5, wherein said latch is a slam latch.

7. A rack system for containing electronic and/or electrical equipment according to claim 3, wherein said front panel comprises two panels, each having a side edge mounted on an associated said vertical support member by at least one hinge, whereby said two panels form a dual-door.

8. A rack system for containing electronic and/or electrical equipment according to claim 1, wherein said panels include a back panel, wherein a first side edge of said back panel is attached to an associated said vertical support member of said rack system by at least one hinge, such that said back panel is rotatable about said vertical support member, wherein said back panel forms an (Tenable door.

9. A rack system for containing electronic and/or electrical equipment according to claim 8, wherein said back panel include a latch attached to a second side edge opposite to said first side edge where the hinge is attached, wherein said latch is adapted to lock said second side edge to an associated vertical support member.

10. A rack system for containing electronic and/or electrical equipment according to claim 1, wherein said panels include tabs extending outwardly from the edges of said panels, and wherein said vertical or horizontal support members define slots facing the tabs for receiving said tabs of said panels.

11. A rack system for containing electronic and/or electrical equipment according to claim 10, wherein said panels are removable from said rack system.

12. A rack system for containing electronic and/or electrical equipment according to claim 1 wherein said top panel define at least one hole passing through said top panel.

13. A rack system for containing electronic and/or electrical equipment according to claim 1, wherein said panels include a bottom panel mounted to the base frame, wherein said bottom panel defines at least one hole passing through said bottom panel.

14. A rack system for containing electronic and/or electrical equipment according to claim 1, wherein the base frame comprises four casters mounted on four corners of the base frame.

15. A rack system for containing electronic and/or electrical equipment according to claim 1 further comprising at least one strut extending between two associated said vertical support members.

16. A rack system for containing electronic and/or electrical equipment according to claim 1, herein each said horizontal support member extends between two opposite ends, wherein each end is partially cut away to fit the contour of said vertical support member.

* * * * *

UNITED STATES PATENT AND TRADEMARK OFFICE
CERTIFICATE OF CORRECTION

| | | |
|---|---|---|
| PATENT NO. | : 8,083,301 B2 | Page 1 of 1 |
| APPLICATION NO. | : 12/355493 | |
| DATED | : December 27, 2011 | |
| INVENTOR(S) | : Andrew Hudz et al. | |

It is certified that error appears in the above-identified patent and that said Letters Patent is hereby corrected as shown below:

Please replace column 7, line 27, with the following amended version:

-- wherein each horizontal support member of said base [[baśe]] --

Signed and Sealed this

Thirteenth Day of November, 2012

David J. Kappos
*Director of the United States Patent and Trademark Office*